(12) United States Patent
Matsumoto et al.

(10) Patent No.: US 9,219,008 B2
(45) Date of Patent: Dec. 22, 2015

(54) GRAPHENE PATTERNING METHOD AND PATTERNING MEMBER

(71) Applicant: TOKYO ELECTRON LIMITED, Tokyo (JP)

(72) Inventors: Takashi Matsumoto, Tsukuba (JP); Yusaku Kashiwagi, Tsukuba (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/153,788

(22) Filed: Jan. 13, 2014

(65) Prior Publication Data

US 2014/0199829 A1   Jul. 17, 2014

(30) Foreign Application Priority Data

Jan. 15, 2013   (JP) .................. 2013-004490

(51) Int. Cl.
*H01L 21/768* (2006.01)
*H01L 23/532* (2006.01)

(52) U.S. Cl.
CPC .... *H01L 21/76823* (2013.01); *H01L 21/76838* (2013.01); *H01L 23/53276* (2013.01); *H01L 2924/0002* (2013.01)

(58) Field of Classification Search
CPC ................. H01L 21/76823; H01L 21/76838; H01L 23/53276; H01L 2924/002
USPC .......................................... 438/610
See application file for complete search history.

(56) References Cited

FOREIGN PATENT DOCUMENTS

JP   2012-31024 A   2/2012

OTHER PUBLICATIONS

Keun Soo Kim, Yue Zhao, Houk Jang, Sang Yoon Lee, Jong Min Kim, Kwang S. Kim, Jong-Hyun Ahn, Philip Kim, Jae-Young Choi & Byung Hee Hong, Large-scale pattern growth of graphene films for stretchable transparent electrodes, vol. 457, Feb. 5, 2009.*
Yonglai Zhang, Li Guob, Shu Wei, Yinyan He, Hong Xia, Qidai Chen, Hong-Bo Sun, Feng-Shou Xiao, Direct imprinting of microcircuits on graphene oxides film by femtosecond laser reduction, Nano Today (2010) 5, 15-20.*

* cited by examiner

*Primary Examiner* — Mark Tornow
(74) *Attorney, Agent, or Firm* — Nath, Goldberg and Meyer; Jerald L. Meyer

(57) ABSTRACT

A graphene patterning method for forming a graphene of predetermined pattern includes bringing a patterning member in which a catalyst metal layer of the predetermined pattern is formed into contact with a substrate having a graphene oxide film. In bringing the patterning member, the catalyst metal layer is brought into contact with the graphene oxide film.

6 Claims, 8 Drawing Sheets

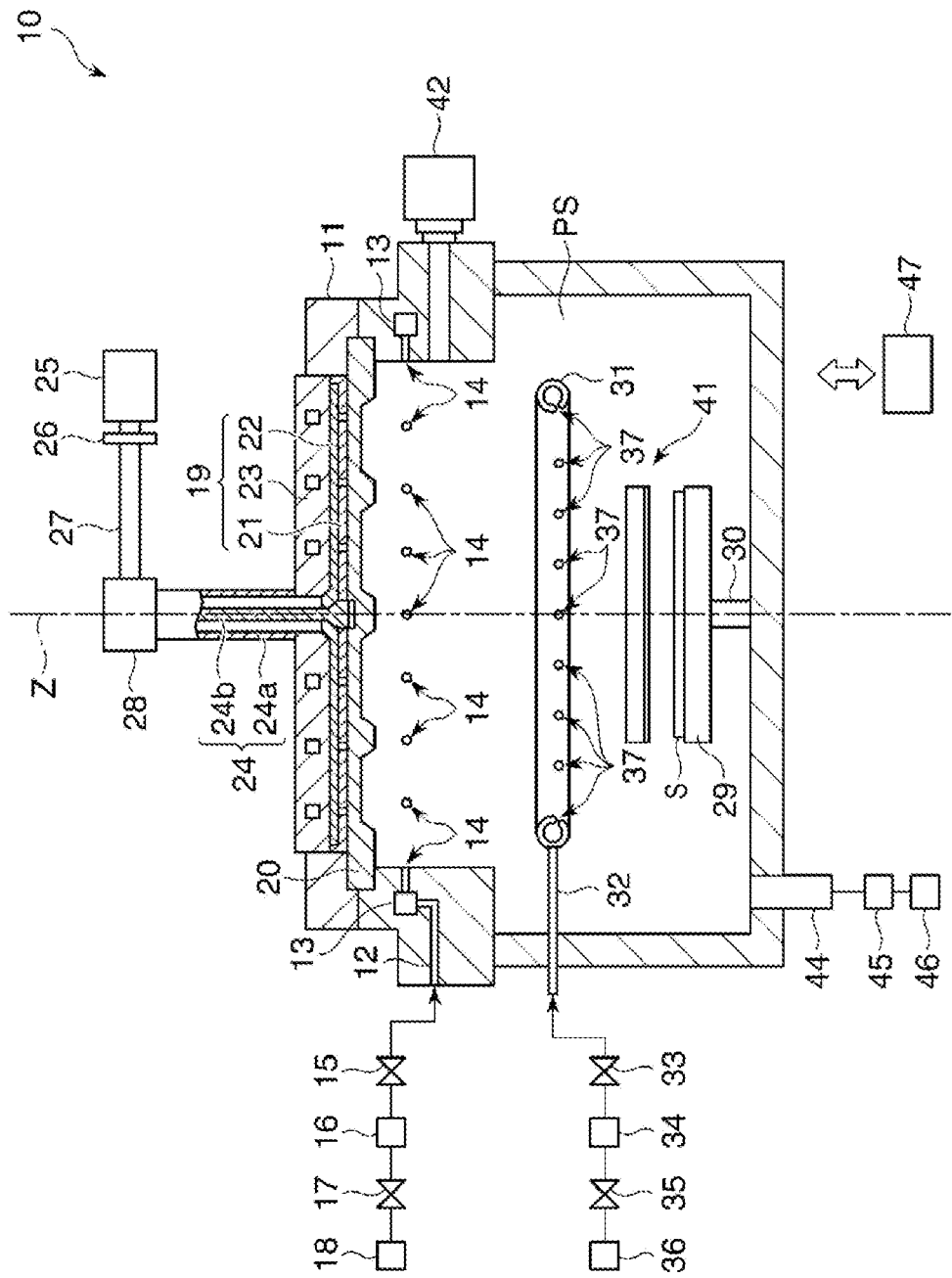

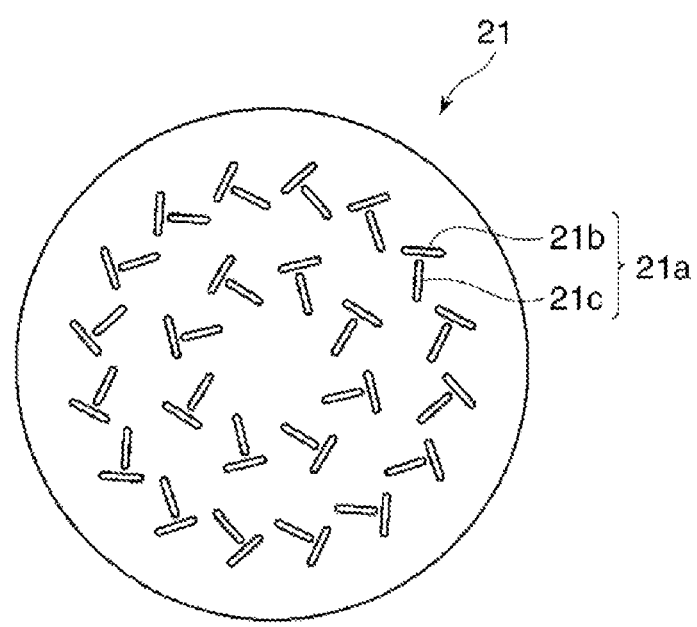

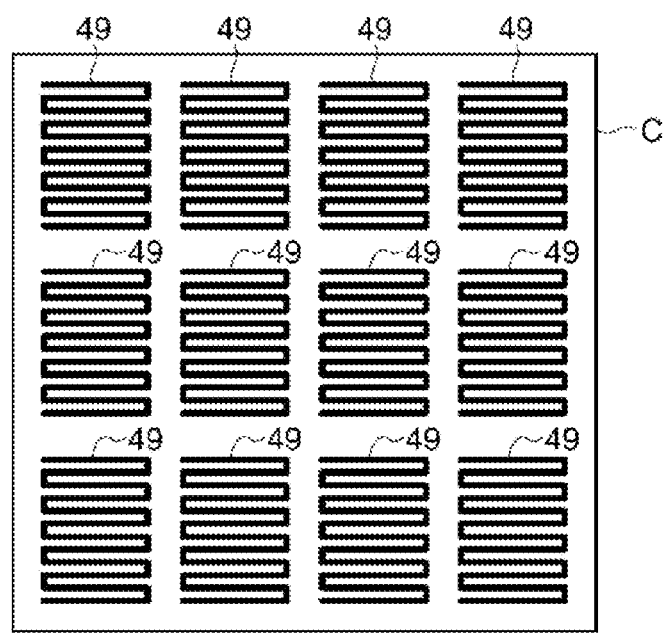

GRAPHENE PATTERNING METHOD AND PATTERNING MEMBER

CROSS-REFERENCE TO RELATED APPLICATION

This application claims the benefit of Japanese Patent Application No. 2013-004490, filed on Jan. 15, 2013 in the Japan Patent Office, the disclosure of which is incorporated herein in its entirety by reference.

TECHNICAL FIELD

The present disclosure generally relates to a graphene patterning method and a patterning member which are capable of forming a graphene of a predetermined pattern.

BACKGROUND

Conventionally, a graphene was regarded as a substitute material of ITO which constitutes a transparent conductive film. The graphene is a film made of an array of carbon atoms bonded to one another. The thickness of the graphene is several nanometers which are equivalent to a thickness of several carbon atoms. In general, to form the graphene on a substrate, the substrate is initially dipped into a suspension to form a graphene oxide film on the substrate and the graphene oxide film on the substrate is reduced.

The graphene, which is composed solely of carbon atoms, has excellent electric conductivity and a thickness of several nanometers, and thus, it is recently considered to apply the graphene to wirings of a damascene structure in a semiconductor device. When forming wirings with the graphene, electron beam lithography that can perform fine processing is performed as a wiring processing mechanism.

However, as the electron beam lithography scans a surface of the graphene with an electron beam, such process is time consuming and manufacturing efficiency is decreased.

SUMMARY

Some embodiments of the present disclosure provide a graphene patterning method and a patterning member which are capable of forming a graphene of a predetermined pattern with ease.

According to some aspects of the present disclosure, there is provided a graphene patterning method for forming a graphene of a predetermined pattern, including: bringing a patterning member in which a catalyst metal layer of the predetermined pattern is formed into contact with a substrate having a graphene oxide film, wherein, in bringing the patterning member, the catalyst metal layer is brought into contact with the graphene oxide film.

According to some other aspects of the present disclosure, there is provided a patterning member configured to make contact with a substrate having a graphene oxide film, including a catalyst metal layer of a predetermined pattern formed on a surface of the patterning member making contact with the graphene oxide film.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a sectional view schematically showing a configuration of a substrate processing apparatus for performing a graphene patterning method according to an embodiment of the present disclosure.

FIG. 2 is a bottom view of a slot plate employed in the substrate processing apparatus shown in FIG. 1.

FIGS. 3A to 3C are diagrams schematically showing a constitution of the patterning member denoted in FIG. 1, wherein FIG. 3A is a side view, FIG. 3B is a bottom view of the patterning member, and FIG. 3C is an enlarged bottom view of the portion designated by C in FIG. 3B.

FIGS. 5A to 5C are diagrams for explaining the structure of the graphene pattern formed on the substrate through the graphene patterning method of FIGS. 4A to 4B, wherein FIG. 5A is a plan view of a substrate, FIG. 5B is an enlarged plan view of the portion designated by B in FIG. 5A, and FIG. 5C is a sectional view taken along line C-C in FIG. 5B.

DETAILED DESCRIPTION

Figure 3A:
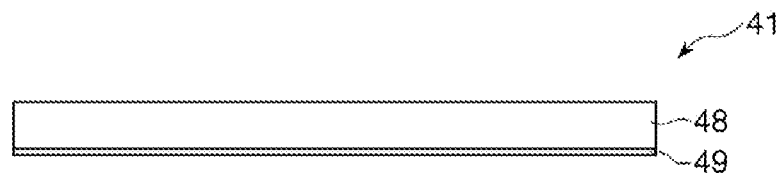

An embodiment of the present disclosure will now be described in detail with reference to the drawings.

FIG. 1 is a sectional view schematically showing a configuration of a substrate processing apparatus for performing a graphene patterning method, according to an embodiment of the present disclosure. The present substrate processing apparatus is configured to form a graphene by generating plasma from a reducing gas to reduce a graphene oxide film formed on a substrate.

Referring to FIG. 1, the substrate processing apparatus 10 includes a processing vessel 11 of a substantially cylindrical shape. The processing vessel 11 extends along a direction in which an axis Z is elongated (hereinafter referred to as a "Z-axis direction") in the FIG. 1. The interior of the processing vessel 11 is a processing space PS in which plasma processing is performed on a substrate S composed of, e.g., Si (silicon), $SiO_2$ (silica) or glass.

Gas lines 12 and 13 are disposed in a sidewall of the processing vessel 11. The gas line 12 is led from the outside of the processing vessel 11 to the sidewall of the processing vessel 11 and is connected to the gas line 13 within the sidewall. The gas line 13 is composed of a ring-shaped flow path formed within the sidewall and is arranged so as to surround the processing space PS. The gas line 13 has a plurality of injection holes 14 which communicates with the processing space PS. The gas line 12 is connected to a gas source 18 through a valve 15, a mass flow controller 16 and a valve 17 outside the processing vessel 11.

An antenna 19 is installed on an upper portion of the processing vessel 11. A dielectric window 20 is provided between the antenna 19 and the processing space PS. The dielectric window 20 has a substantially disc-like shape. The dielectric window 20 is made of, e.g., quartz or alumina, and is configured to hermetically seal the processing space PS. The antenna 19 is a radial line slot antenna which supplies microwaves into the processing space PS. The antenna 19 includes a slot plate 21, a dielectric plate 22 and a cooling jacket 23, which are sequentially stacked from the bottom.

The dielectric plate 22 has a substantially disc-like shape and shortens the wavelength of microwaves delivered from a coaxial waveguide tube 24, which will be described later. The dielectric plate 22 is made of, e.g., quartz or alumina.

As shown in FIG. 2, the slot plate 21 is a substantially disc-like metal plate having a plurality of slot pairs 21a. The plurality of slot pairs 21a are arranged so as to form a plurality of concentric circles. Each of the slot pairs 21a is composed of two slot holes 21b and 21c which are orthogonal to each other.

A coaxial waveguide tube 24, a microwave generator 25, a tuner 26, a waveguide tube 27 and a mode converter 28 are disposed above the antenna 19. The microwave generator 25 is connected to the antenna 19 through the tuner 26, the waveguide tube 27, the mode converter 28 and the coaxial waveguide tube 24, which cooperate with one another to deliver microwaves of, e.g., 2.45 GHz, generated by the microwave generator 25 to the antenna 19.

The coaxial waveguide tube 24 extends in the Z-axis direction and includes an outer conductor 24a and an inner conductor 24b. The outer conductor 24a is formed with a conductor of a substantially cylindrical shape and its lower end is connected to the cooling jacket 23 of the antenna 19. The inner conductor 24b is formed with a conductor of a cylindrical columnar shape, which is disposed to be accommodated within the outer conductor 24a and its lower end is connected to the slot plate 21 of the antenna 19.

In the substrate processing apparatus 10, the microwaves delivered from the coaxial waveguide tube 24 are propagated into the dielectric plate 22 and are applied from the respective slot pairs 21a of the slot plate 21 to the dielectric window 20. Then, the microwaves are transmitted through the dielectric window 20 and are introduced into the processing space PS. The microwaves introduced into the processing space PS generate electric fields just below the dielectric window 20. The electric fields excite a process gas introduced into the processing space PS, thereby generating plasma.

The substrate processing apparatus 10 further includes a mounting table 29 arranged within the processing space PS. The mounting table 29 is configured to mount a substrate S thereon. The mounting table 29 is supported by a support shaft 30 which protrudes upward from the bottom of the processing vessel 11 along the Z-axis direction. The mounting table 29 includes an attraction and hold mechanism (not shown) of the substrate S and a temperature control mechanism (not shown) of the substrate S in the mounting table 29.

A gas supply ring 31 facing the mounting table 29 and extending about the axis Z is disposed within the processing space PS. A gas pipe 32 extending from the processing space PS to the outside of the processing vessel 11 is connected to the gas supply ring 31. Outside the processing vessel 11, the gas pipe 32 is connected to a gas source 36 through a valve 33, a mass flow controller 34 and a valve 35. The gas supply ring 31 has a plurality of injection holes 37 which communicates with the processing space PS.

The substrate processing apparatus 10 further includes a patterning member 41 disposed between the gas supply ring 31 and the mounting table 29 in the processing space PS. The patterning member 41 has a substantially disc-like shape and is moved along the Z-axis direction by an elevating mechanism (not shown). The patterning member 41 can be moved down to make contact with the substrate S mounted on the mounting table 29. The structure and function of the patterning member 41 will be described later.

A manometer 42 that measures the pressure of the processing space PS is disposed in the sidewall of the processing vessel 11. An exhaust pipe 44 is arranged at the bottom portion of the processing vessel 11. A pressure regulator 45 and a vacuum pump 46 are connected to the exhaust pipe 44.

In the substrate processing apparatus 10, the flow rate of a process gas supplied from the gas line 13 or the gas supply ring 31 is adjusted based on a pressure value measured by the manometer 42. The pressure of the processing space PS is regulated by adjusting the flow rate of a process gas and by controlling the operations of the pressure regulator 45 and the vacuum pump 46.

The substrate processing apparatus 10 is connected to a controller 47. The controller 47 controls the operations of respective elements of the substrate processing apparatus 10 pursuant to a program corresponding to a recipe which defines processing contents.

Figure 3B:
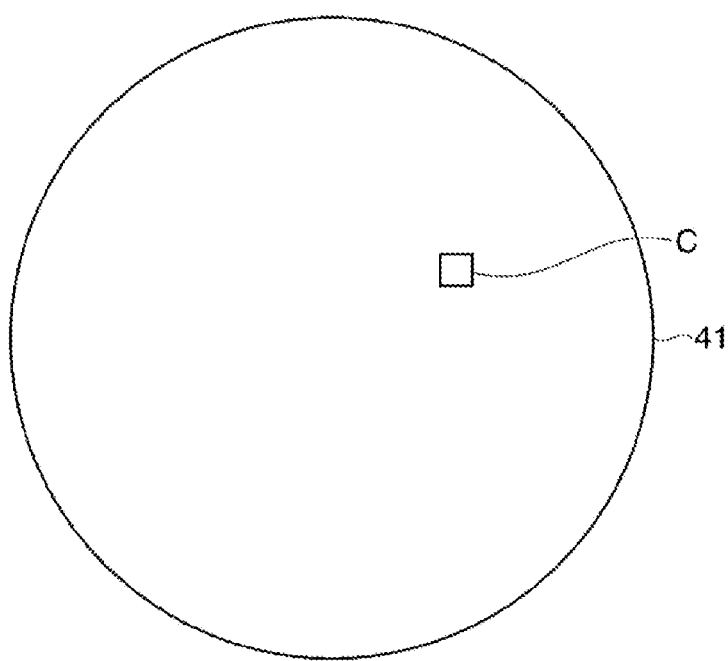

FIGS. 3A to 3C are diagrams schematically showing a constitution of the patterning member denoted in FIG. 1. FIG. 3A is a side view of the patterning member, FIG. 3B is a bottom view of the patterning member, and FIG. 3C is an enlarged bottom view of a portion designated by C in FIG. 3B.

Referring to FIGS. 3A to 3C, the patterning member 41 includes a base member 48 formed by a metal coated with, e.g., a resin or an insulating film, and a plurality of catalyst metal layers 49 having a predetermined pattern. The patterning member 41 is disposed above the mounting table 29. Therefore, when the patterning member 41 is moved down along the Z-axis direction, the lower surface of the patterning member 41 makes contact with the upper surface of the substrate S mounted on the mounting table 29.

The catalyst metal layers 49 having a predetermined pattern are formed on the lower surface of the patterning member 41. The respective catalyst metal layers 49 are arranged so that, when the lower surface of the patterning member 41 makes contact with the upper surface of the substrate S mounted on the mounting table 29, the catalyst metal layers 49 can face a plurality of half-finished products of semiconductor devices (not shown) formed on the upper surface of the substrate S. The predetermined pattern of each of the catalyst metal layers 49 is identical with, e.g., the wiring shape in each of the semiconductor devices.

In the present embodiment, a graphene oxide film covers the upper surface of the substrate S and potions of the graphene oxide film are in contact with the catalyst metal layers 49. In this case, when the lower surface of the patterning member 41 makes contact with a graphene oxide film, the activation energy of the portions of the graphene oxide film, which are in contact with the catalyst metal layers 49, is decreased. Due to the decrease in the activation energy, the reductive reaction on the graphene oxide film selectively occurs only at the portions of the graphene oxide film in contact with the catalyst metal layers 49. As such, the portions of the graphene oxide film are selectively reduced to form a pattern corresponding to the predetermined pattern of the respective catalyst metal layers 49. In other words, such process allows a graphene of a predetermined pattern to form on the graphene oxide film.

The metal forming the catalyst metal layers 49 preferably includes a reducing metal, e.g., at least one of Cu (copper), Ag (silver), Au (gold), Pt (platinum), Cr (chromium), Mn (manganese), Fe (iron), Co (cobalt), Ni (nickel) and Mo (molybdenum). The catalyst metal layers 49 are formed by, e.g., vapor deposition or plating.

Next, a graphene patterning method will be described according to an embodiment of the present disclosure.

FIGS. 4A to 4D are diagrams showing a process of the graphene patterning method according to an embodiment of the present disclosure.

First, a graphene oxide solution is applied to the surface of the substrate S on which a plurality of half-finished products of semiconductor devices (not shown) is formed. The graphene oxide solution is attached to the surface of the substrate S by performing one of a spin-coating method, a dip-coating method, a filtration method and the like. Thereafter, a curing method is performed to form a graphene oxide film 50. By performing the above processes, the graphene oxide film 50 of 1 nm to 50 nm in thickness (see FIG. 4A) is formed on the substrate S.

Then, the substrate S is carried into the processing vessel 11 of the substrate processing apparatus 10 and is mounted on the mounting table 29 to face the patterning member 41. Since a plurality of catalyst metal layers 49 having a predetermined pattern is formed on the lower surface of the patterning member 41, the graphene oxide film 50 faces the respective catalyst metal layers 49 (see FIG. 4B).

Subsequently, the interior of the processing vessel 11 is hermetically sealed. From the respective injection holes 14 of the gas line 13 or the respective injection holes 37 of the gas supply ring 31, an Ar (argon) gas is introduced at a flow rate of, e.g., 400 sccm to 2000 sccm; a $H_2$ (hydrogen) gas as a reducing gas is introduced at a flow rate of, e.g., 100 sccm to 2000 sccm; and a $C_2H_4$ (ethylene) gas as a reducing gas is introduced at a flow rate of, e.g., 6 sccm to 120 sccm into the processing space PS. The pressure of the processing space PS is regulated to, e.g., 0.1 Torr to 10 Torr, by the pressure regulator 45 or the like. The substrate S is heated to, e.g., 300 degree C. to 1100 degree C., by the temperature adjusting mechanism of the mounting table 29. Thereafter, microwaves are delivered from the coaxial waveguide tube 24 to the antenna 19 to generate electric fields in the processing space PS, so that the plasma of the reducing gas is generated from the $H_2$ gas and the $C_2H_4$ gas.

Figure 4A:
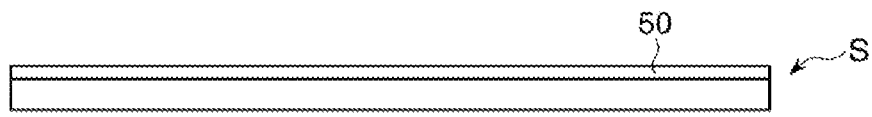
FIGS. 4A to 4D are diagrams showing a process of the graphene patterning method according to an embodiment of the present disclosure.
Figure 4B:
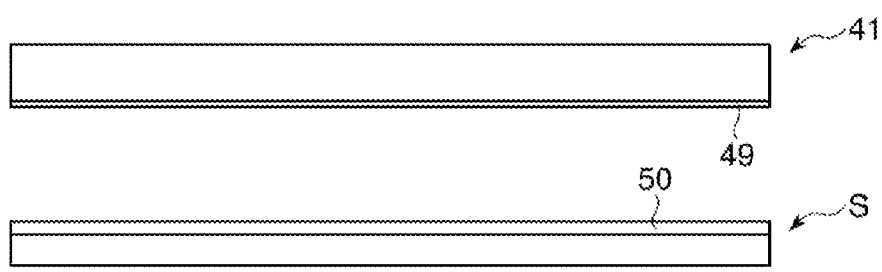
Figure 4C:
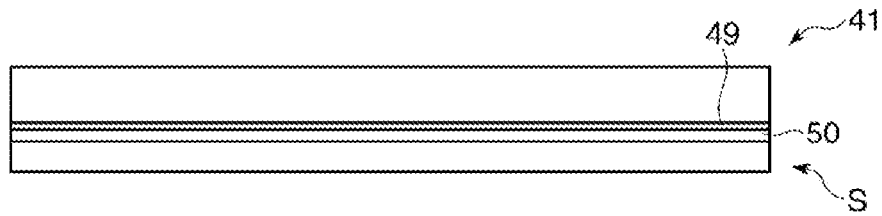

Next, the patterning member 41 is moved down along the Z-axis direction and keeps in contact with the substrate S for, e.g., 10 seconds to 120 minutes, preferably 10 minutes to 120 minutes, while the respective catalyst metal layers 49 keep in contact with the graphene oxide film 50 (see FIG. 4C). At this time, the plasma of the reducing gas is introduced into a small gap of, e.g., a few micrometers between the respective catalyst metal layers 49 and the graphene oxide film 50. Since the activation energy of the portions of the graphene oxide film 50, which are in contact with the respective catalyst metal layers 49, is decreased, the portions of the graphene oxide film 50, which are in contact with the respective catalyst metal layers 49, are easily reduced by the plasma of the reducing gas, thereby generating a graphene. On the other hand, the activation energy of portions of the graphene oxide film 50, which are not in contact with the respective catalyst metal layers 49, is not decreased. For that reason, no reductive reaction occurs in the portions of the graphene oxide film 50, which are not in contact with the respective catalyst metal layers 49, and a graphene pattern is not generated. In other words, the portions of the graphene oxide film 50, which are in contact with the respective catalyst metal layers 49, are selectively reduced to generate a graphene pattern. Consequently, a graphene having a pattern identical to the predetermined pattern of each of the catalyst metal layers 49 can be formed on the graphene oxide film 50.

Figure 4D:
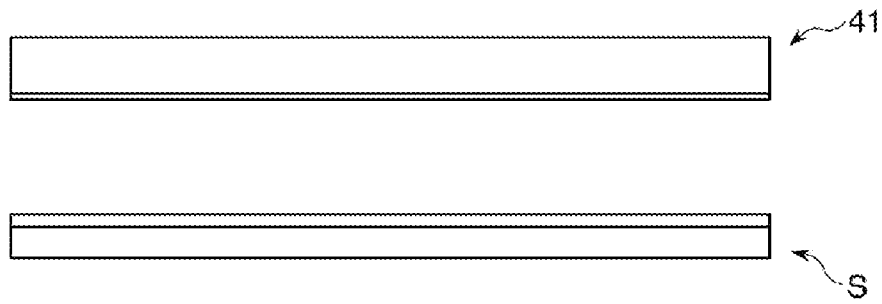

Thereafter, the patterning member 41 is moved up along the Z-axis direction and is spaced apart from the substrate S (see FIG. 4D). The graphene patterning method according to the present embodiment is terminated.

Figure 5A:
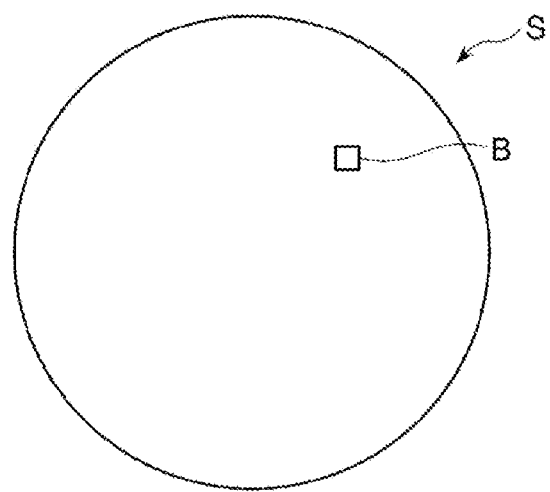
Figure 5B:
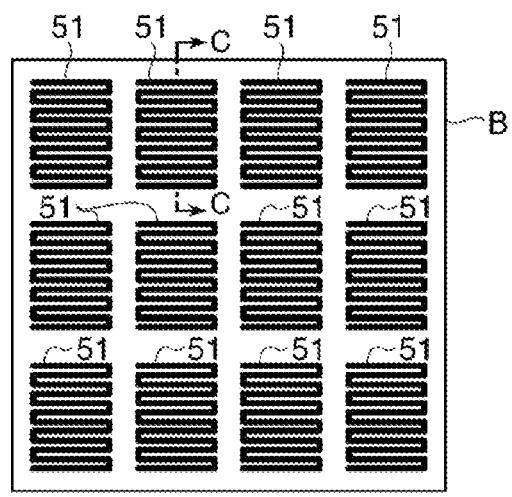
Figure 5C:
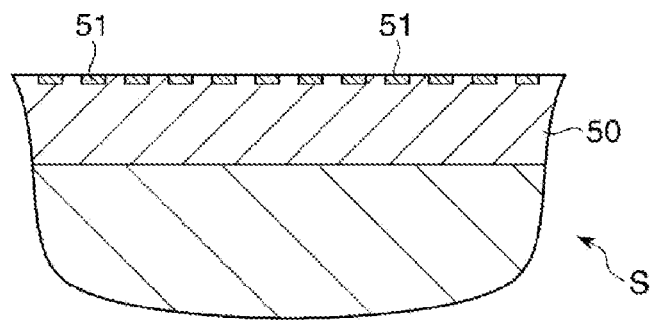

FIGS. 5A to 5C are diagrams for explaining the structure of the graphene pattern formed on the substrate through the graphene patterning method of FIGS. 4A to 4B. FIG. 5A is a plan view of the substrate, FIG. 5B is an enlarged plan view of the portion designated by B in FIG. 5A, and FIG. 5C is a sectional view taken along line C-C in FIG. 5B.

As shown in FIGS. 5A and 5B, a plurality of wirings 51, each composed of a graphene having a pattern identical to the predetermined pattern of each of the catalyst metal layers 49, is formed on the surface of the substrate S. The respective wirings 51 are formed in one-to-one correspondence to the respective catalyst metal layers 49. Since the reductive reaction of the graphene oxide film 50 occurs only on a surface layer, the thickness of each of the wirings 51 becomes a few nanometers. However, since the graphene pattern constituting each of the wirings 51 is a good conductor, the graphene pattern can sufficiently serve as the wiring even though the thickness thereof is a few nanometers. Further, the respective wirings 51 except their surfaces are surrounded by the graphene oxide film 50, which is an insulating film, so that the wirings 51 are insulated from one another.

According to the present embodiment, when the catalyst metal layers 49 of predetermined pattern formed in the patterning member 41 come into contact with the graphene oxide film 50 of the substrate S, a reductive reaction selectively occurs only in the portions of the graphene oxide film 50 corresponding to the predetermined patterns of the catalyst metal layers 4. Thus, the wirings 51, each composed of a graphene having a predetermined pattern, are formed. In other words, the wirings 51 of predetermined pattern can be easily formed by merely bringing the patterning member 41 into contact with the substrate S.

According to the present embodiment, the reductive reaction of the graphene oxide film 50 is performed using the catalyst metal layers 49. Since the metal constituting the catalyst metal layers 49 does not react with the graphene oxide film 50, it is possible to eliminate a metal compound as an impurity being mixed into the wirings 51 formed by the reduction. Each of the catalyst metal layers 49 merely acts as a catalyst. Therefore, the catalyst metal layers 49 are not consumed. This makes it possible to enhance the reusability of the patterning member 41.

According to the present embodiment, the patterning member 41 includes a plurality of catalyst metal layers 49 of predetermined pattern at its lower surface, which comes into contact with the substrate S. Therefore, a plurality of wirings 51 having a predetermined pattern can be formed as desired by merely bringing the patterning member 41 into contact with the substrate S. This makes it possible to increase the manufacturing efficiency of semiconductor devices.

According to the present embodiment, the wirings 51, each composed of a graphene, are formed by partially reducing the graphene oxide film 50. Since the reductive reaction of the graphene oxide film 50 occurs only in the surface layer thereof and the thickness of each of the wirings 51 is nothing more than a few nanometers, the periphery of each of the wirings 51 is necessarily surrounded by the graphene oxide film 50, which is an insulator. That is to say, the respective wirings 51 can be insulated simultaneously with the formation thereof.

According to the present embodiment, the respective catalyst metal layers 49 of the patterning member 41 merely make contact with the graphene oxide film 50 and are not stacked on the graphene oxide film 50. Thus, the catalyst metal layers do not remain in the manufactured semiconductor device. Accordingly, there is no need to set a process for removing the catalyst metal layers in a post process. As a result, it is possible to further increase the production efficiency of semiconductor devices.

According to the present embodiment, when the catalyst metal layers 49 of predetermined pattern formed in the patterning member 41 makes contact with the graphene oxide film 50 of the substrate S, plasma is generated from the reducing gas and the reductive reaction of the graphene oxide film 50 is performed using the plasma. As the plasma is high in energy, when compared to a case where a non-plasma reducing gas is used, it is possible to accelerate the reductive reaction of the graphene oxide film 50.

According to the present embodiment, the substrate S is heated to, e.g., 300 degree C. to 1100 degree C. It is therefore possible to accelerate the reductive reaction of the graphene oxide film 50.

While one embodiment of the present disclosure has been described above, the present disclosure is not limited to the aforementioned embodiment.

In the aforementioned embodiment, although the $H_2$ gas or the $C_2H_4$ gas is used as the reducing gas, the reducing gas may not be limited thereto but may include an $NH_3$ (ammonia) gas, a $H_4N_2$ (hydrazine) gas or a hydrocarbon gas such as a $CH_4$ (methane) gas or a $C_2H_2$ (acetylene) gas. In particular, the $C_2H_4$ gas and the $C_2H_2$ gas are highly reactive. It is therefore possible to eliminate the need to heat the substrate S to a temperature of 300 degree C. to 1100 degree C. If the generation of plasma of the reducing gas is used in combination, the graphene oxide film 50 can be reduced even though the temperature of the substrate S is kept approximately at a room temperature.

In the aforementioned embodiment, the graphene oxide film 50 is reduced by generating the plasma from the reducing gas. However, if a highly reactive gas is used or if the substrate S is kept at a high temperature, it is not necessarily required to generate plasma from the reducing gas, so that the graphene oxide film 50 can be reduced using the reducing gas as it is.

In the aforementioned embodiment, the graphene oxide film is reduced by using, in combination, the contact of the catalyst metal layers 49 and the introduction of the reducing gas into the processing vessel 11. However, the graphene oxide film may be reduced by using only the contact of the catalyst metal layers 49. In this case, there is no need to hermetically seal the interior of the processing vessel 11.

In the aforementioned embodiment, the substrate S is heated. However, the patterning member 41 may be heated instead of the substrate S. The pressure is not limited to 0.1 Torr to 10 Torr. Particularly, if a gas showing low reactivity with an $O_2$ gas is used, the pressure may be substantially equal to the atmospheric pressure.

There is no particular need to perform a surface treatment upon the surfaces of the respective catalyst metal layers 49. However, a surface treatment such as smoothening or the like on the surface of the respective catalyst metal layers 49 may be performed to improve the contact state of the respective catalyst metal layers 49 and the graphene oxide film. This makes it sure to cause a reductive reaction at the portions where the respective catalyst metal layers 49 and the graphene oxide film 50 face each other, thereby forming the wirings 51 with uniformity.

In the aforementioned embodiment, the substrate S made of Si, $SiO_2$ or glass is heated to, e.g., 300 degree C. to 1100 degree C. However, if the substrate S is a flexible substrate made of a plastic, the substrate S is heated to, e.g., 100 degree C. to 150 degree C. to prevent the substrate S from being softened due to the heating. In this case, it is preferred that the intensity of the microwaves introduced into the processing space PS is made higher to increase a generation amount of plasma and a generation amount of radicals, thereby accelerating the reductive reaction of the graphene oxide film 50.

Embodiments

Next, embodiments of the present disclosure will be described in detail.

First, the respective catalyst metal layers 49 of the patterning member 41 were made from Ni having a thickness of 5 nm. In the substrate processing apparatus 10, the interior of the processing vessel 11 was hermetically sealed. An Ar gas was introduced into the processing space PS at a flow rate of 450 sccm, and a $H_2$ gas as a reducing gas was introduced into the processing space PS at a flow rate of 462 sccm. The pressure of the processing space PS was regulated to 400 Pa. The substrate S was heated to 470 degree C. Electric fields were generated within the processing space PS, thereby generating plasma of the reducing gas from the $H_2$ gas. The patterning member 41 was moved down along the Z-axis direction and was in contact with the substrate S for 60 minutes, whereby the respective catalyst metal layers 49 come into contact with the graphene oxide film 50 (having a thickness of 50 nm and a sheet resistance value of 1MΩ/□ or more).

Thereafter, the sheet resistance value of the graphene pattern generated by the selective reduction of the graphene oxide film 50 was measured. The sheet resistance value thus measured was 39650Ω/□ (Comparative Example 1).

Moreover, the respective catalyst metal layers 49 of the patterning member 41 were made from Ni having a thickness of 30 nm. Subsequently, the same processing as that of Comparative Example 1 was performed. The sheet resistance value of the formed graphene pattern was measured. The measured sheet resistance value was 7291Ω/□ (Example 1).

In addition, the respective catalyst metal layers 49 of the patterning member 41 were made from Cu having a thickness of 200 nm. Subsequently, the same processing as that of Comparative Example 1 was performed. The sheet resistance value of the formed graphene pattern was measured. The measured sheet resistance value was 5893Ω/□ (Example 2).

Figure 6:
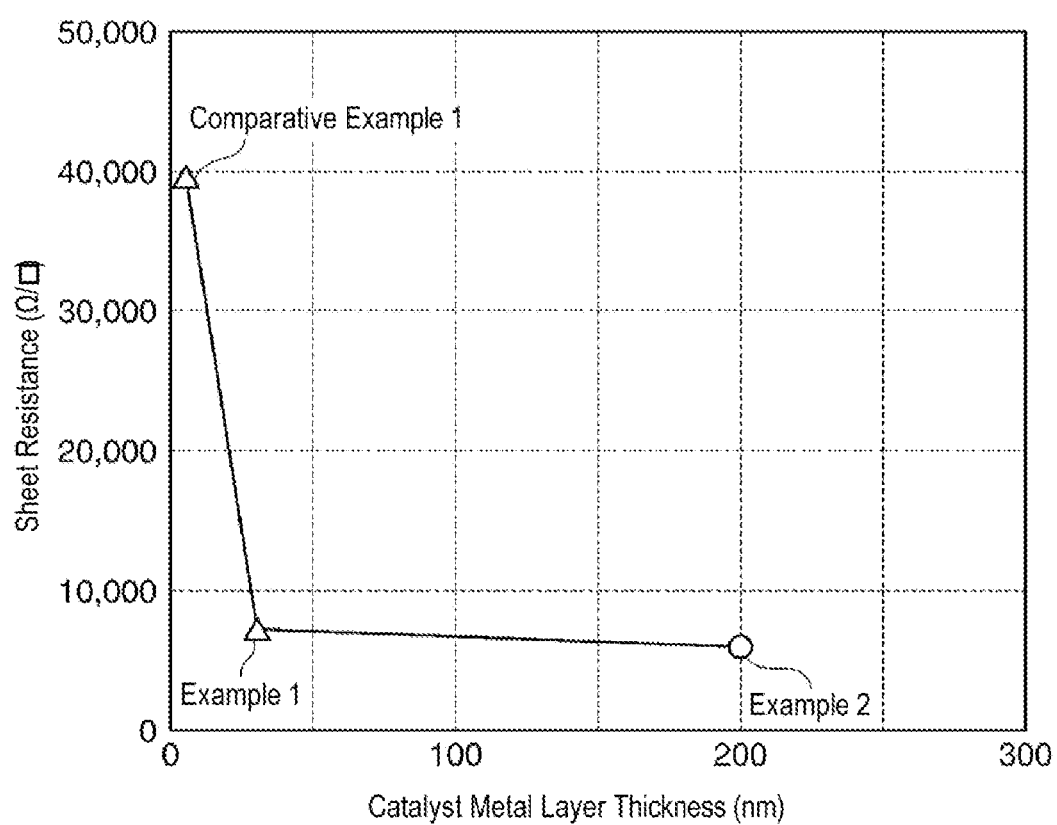
FIG. 6 is a graph representing measured sheet resistance values of Examples 1 and 2 and Comparative Example 1.

FIG. 6 is a graph showing the measured sheet resistance values of Examples 1 and 2 and Comparative Example 1.

It can be noted from the graph shown in FIG. 6 that the sheet resistance of the graphene pattern formed by the reduction becomes lower as the thickness of the respective catalyst metal layers 49 of the patterning member 41 grows larger. If the thickness of the catalyst metal layers 49 is changed from 5 nm (Comparative Example 1) to 30 nm (Example 1), the sheet resistance is significantly reduced. On the other hand, if the thickness of the catalyst metal layers 49 is changed from 30 nm (Example 1) to 200 nm (Example 2), the sheet resistance is not particularly reduced. Based on the above, it shows that if the thickness of the catalyst metal layers 49 is equal to or larger than 30 nm, the graphene oxide film 50 can be sufficiently reduced.

Next, the same processing as that of Comparative Example 1 was performed except that the respective catalyst metal layers 49 of the patterning member 41 are formed with Ni having a thickness of 30 nm and further that the patterning member 41 is brought into contact with the substrate S for 5 minutes. The formed sheet resistance value of the graphene pattern was measured. The measured sheet resistance value was 8856Ω/□ (Comparative Example 2).

Moreover, the same processing as that of Comparative Example 2 was performed except that the patterning member 41 is brought into contact with the substrate S for 10 minutes.

The formed sheet resistance value of the graphene pattern was measured. The measured sheet resistance value was 7177Ω/□ (Example 3).

Figure 7:
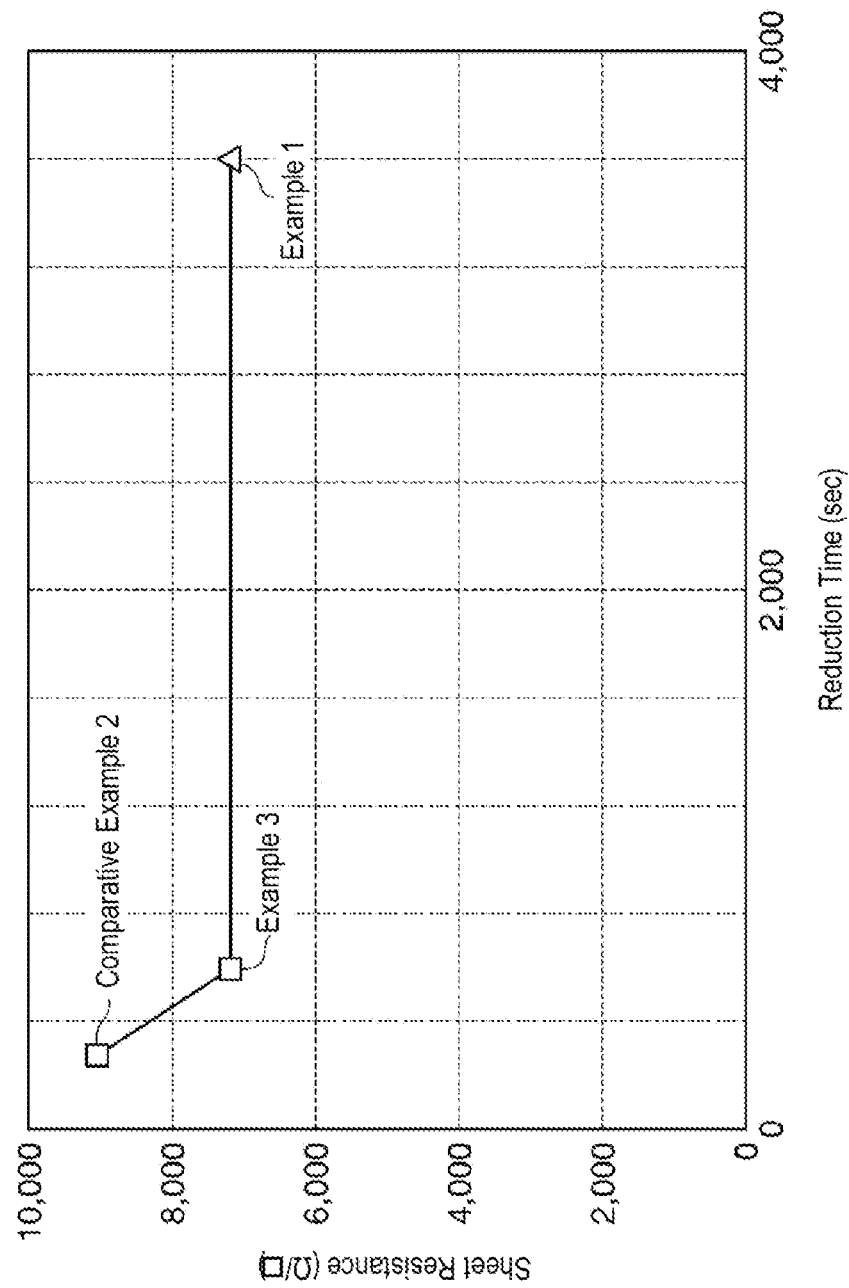
FIG. 7 is a graph representing measured sheet resistance values of Examples 1 and 3 and Comparative Example 2.

FIG. 7 is a graph representing the measured sheet resistance values of Examples 1 and 3 and Comparative Example 2.

It can be noted from the graph shown in FIG. 7 that the sheet resistance of the graphene pattern formed by the reduction becomes lower as the time of contact of the patterning member 41 with the substrate S becomes longer. If the contact time is changed from 5 minutes (Comparative Example 2) to 10 minutes (Example 3), the sheet resistance is significantly reduced. On the other hand, if the contact time is changed from 10 minutes (Example 3) to 60 minutes (Example 1), the sheet resistance is substantially unchanged. It is therefore possible to know that, if the time of contact of the patterning member 41 with the substrate S is equal to or longer than 10 minutes, the thickness of portions of the graphene oxide film 50 can be sufficiently reduced.

According to the present disclosure, the catalyst metal layers of predetermined pattern formed in the patterning member are brought into contact with the graphene oxide film of the substrate, whereby a reductive reaction occurs in the portions of the graphene oxide film corresponding to the predetermined patterns of the catalyst metal layers. Thus, a graphene of predetermined pattern is formed. That is to say, a graphene of predetermined pattern can be easily formed by merely bringing the patterning member into contact with the substrate.

While certain embodiments have been described, these embodiments have been presented by way of example only, and are not intended to limit the scope of the disclosures. Indeed, the novel methods and members described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A graphene patterning method for forming a graphene of a predetermined pattern, comprising:
    bringing a patterning member in which a catalyst metal layer of the predetermined pattern is formed into contact with a substrate having a graphene oxide film,
    wherein, in bringing the patterning member, the catalyst metal layer is brought into contact with the graphene oxide film under an environment in which a reducing gas exists.

2. The method of claim 1, wherein plasma is generated from the reducing gas.

3. The method of claim 1, wherein the reducing gas comprises at least one gas selected from the group consisting of a $H_2$ gas, an $NH_3$ gas, a $H_4N_2$ gas, a $CH_4$ gas, a $C_2H_4$ gas and a $C_2H_2$ gas.

4. The method of claim 1, wherein at least one of the substrate and the patterning member is heated.

5. The method of claim 1, wherein the catalyst metal layer comprises at least one metal selected from the group consisting of Cu, Ag, Au, Pt, Cr, Mn, Fe, Co, Ni and Mo.

6. The method of claim 1, wherein the patterning member comprises a plurality of catalyst metal layers of the predetermined pattern making contact with portions of the substrate.

* * * * *